(12) United States Patent
Kim et al.

(10) Patent No.: US 10,410,722 B2
(45) Date of Patent: *Sep. 10, 2019

(54) SEMICONDUCTOR DEVICES

(71) Applicant: SAMSUNG ELECTRONICS CO., LTD., Suwon-si, Gyeonggi-do (KR)

(72) Inventors: Sungwoo Kim, Hwaseong-si (KR); Bong-Soo Kim, Yongin-si (KR); Youngbae Kim, Seoul (KR); Kijae Hur, Seoul (KR); Gwanhyeob Koh, Seoul (KR); Hyeongsun Hong, Seongnam-si (KR); Yoosang Hwang, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/987,207

(22) Filed: May 23, 2018

(65) Prior Publication Data

US 2019/0019554 A1 Jan. 17, 2019

(30) Foreign Application Priority Data

Jul. 14, 2017 (KR) .......................... 10-2017-0089798

(51) Int. Cl.
  *H01L 27/00* (2006.01)
  *G11C 14/00* (2006.01)
  (Continued)

(52) U.S. Cl.
  CPC .......... *G11C 14/0045* (2013.01); *G11C 5/025* (2013.01); *G11C 11/005* (2013.01);
  (Continued)

(58) Field of Classification Search
  CPC ............ H01L 27/10897; H01L 23/528; H01L 27/11524
  See application file for complete search history.

(56) References Cited

U.S. PATENT DOCUMENTS 7,554,147 B2  6/2009  Asano et al.
9,355,851 B2  5/2016  Hong et al.
(Continued)

FOREIGN PATENT DOCUMENTS

JP  2014082287  5/2014
KR  1020090110556  10/2009

OTHER PUBLICATIONS

Office Action issued in corresponding U.S. Appl. No. 15/984,914 dated Jan. 28, 2019.

*Primary Examiner* — Thomas L Dickey
(74) *Attorney, Agent, or Firm* — F. Chau & Associates, LLC

(57) ABSTRACT

A semiconductor device includes: a first memory section, a first peripheral circuit section, and a second peripheral circuit section that are disposed on a substrate; and a second memory section and a wiring section that are stacked on the second peripheral circuit section, wherein the first memory section includes a plurality of first memory cells, each of the first memory cells including a cell transistor and a capacitor connected to the cell transistor, the second memory section includes a plurality of second memory cells, each of the second memory cells including a variable resistance element and a select element coupled in series to each other, and the wiring section includes a plurality of line patterns, wherein the line patterns and the second memory cells are higher than the capacitor with respect to the substrate.

20 Claims, 11 Drawing Sheets

(51) Int. Cl.
  *H01L 27/24* (2006.01)
  *H01L 23/528* (2006.01)
  *H01L 45/00* (2006.01)
  *G11C 13/00* (2006.01)
  *G11C 11/00* (2006.01)
  *G11C 5/02* (2006.01)
  *H01L 27/108* (2006.01)

(52) U.S. Cl.
  CPC ........ *G11C 13/0004* (2013.01); *H01L 23/528* (2013.01); *H01L 27/2427* (2013.01); *H01L 45/06* (2013.01); *H01L 45/1233* (2013.01); *G11C 13/0007* (2013.01); *G11C 2213/15* (2013.01); *G11C 2213/31* (2013.01); *G11C 2213/32* (2013.01); *G11C 2213/52* (2013.01); *G11C 2213/76* (2013.01); *H01L 27/10814* (2013.01); *H01L 27/10823* (2013.01); *H01L 27/10897* (2013.01); *H01L 45/1253* (2013.01); *H01L 45/143* (2013.01); *H01L 45/144* (2013.01); *H01L 45/146* (2013.01); *H01L 45/147* (2013.01)

(56) References Cited

U.S. PATENT DOCUMENTS

| | | |
|---|---|---|
| 9,548,085 B2 | 1/2017 | Saitoh |
| 9,583,556 B2 | 2/2017 | Tu et al. |
| 9,619,357 B2 | 4/2017 | Jain et al. |
| 2004/0173826 A1 | 9/2004 | Natori |
| 2010/0320521 A1 | 12/2010 | Izumi |
| 2013/0285203 A1 | 10/2013 | Hiroi et al. |
| 2015/0053775 A1 | 2/2015 | Kang |
| 2015/0340366 A1 | 11/2015 | Lim et al. |
| 2016/0307962 A1 | 10/2016 | Yi et al. |
| 2017/0069827 A1 | 3/2017 | Lee et al. |
| 2018/0158526 A1 | 6/2018 | Kim |
| 2019/0027200 A1* | 1/2019 | Kim ............ H01L 23/528 |
| 2019/0027482 A1* | 1/2019 | Kim ............ H01L 27/10808 |

\* cited by examiner

SEMICONDUCTOR DEVICES

CROSS-REFERENCE TO RELATED APPLICATION

This U.S. nonprovisional patent application claims priority under 35 U.S.C. § 119 to Korean Patent Application No. 10-2017-0089798 filed on Jul. 14, 2017, the disclosure of which is incorporated by reference herein in its entirety.

TECHNICAL FIELD

The present inventive concept relates to a semiconductor device, and more particularly, to a semiconductor device with memory cells having different operating characteristics.

DISCUSSION OF RELATED ART

Semiconductor devices may include memory devices and logic devices. Memory devices store data. In general, semiconductor memory devices may include volatile memory devices and nonvolatile memory devices. A volatile memory device, for example, a Dynamic Random Access Memory (DRAM) and a Static Random Access Memory (SRAM), is a memory device which loses stored data in the absence of power. A nonvolatile memory device, for example, a programmable read only memory (PROM), an erasable programmable read only memory (EPROM), an electrically erasable programmable read only memory (EEPRM), and a Flash memory device, is a memory device which does not lose stored data in the absence of power.

Next generation semiconductor memory devices, for example, magnetic random access memory (MRAM) and phase change random access memory (PRAM), are high performance and low power consuming devices. The next generation semiconductor memory devices include a material whose resistance differs depending on an applied electric current or voltage and whose resistance is maintained even if the applied electric current or voltage is interrupted.

SUMMARY

According to an exemplary embodiment of the present inventive concept, a semiconductor device may comprise: a first memory section, a first peripheral circuit section, and a second peripheral circuit section that are disposed on a substrate; and a second memory section and a wiring section that are stacked on the second peripheral circuit section, wherein the first memory section may comprise a plurality of first memory cells, each of the first memory cells including a cell transistor and a capacitor connected to the cell transistor, the second memory section may comprise a plurality of second memory cells, each of the second memory cells including a variable resistance element and a select element coupled in series to each other, and the wiring section may comprise a plurality of line patterns, wherein the line patterns and the second memory cells are higher than the capacitor with respect to the substrate.

According to an exemplary embodiment of the present inventive concept, a semiconductor device may comprise: a substrate including a first device region and a second device region; a first memory section on the first device region; and a second memory section and a wiring section stacked on the second device region, wherein the first memory section may comprise a capacitor structure, the second memory section may comprise: a plurality of variable resistance elements arranged on the substrate; and a plurality of select elements coupled in series to corresponding variable resistance elements, and the wiring section may comprise a plurality of line patterns, wherein the line patterns, the variable resistance elements, and the select elements are higher from the substrate than the capacitor structure.

According to an exemplary embodiment of the present inventive concept, a semiconductor device includes a substrate; a first memory section and a first peripheral circuit section disposed next to each other along a first direction; a first wiring section disposed on the first memory section and the first peripheral circuit section; and a second peripheral circuit section, a second wiring section and a second memory section stacked in a second direction substantially perpendicular to the first direction, wherein the second memory section is disposed above the first memory section with respect to the substrate.

DETAILED DESCRIPTION OF THE EMBODIMENTS

Figure 1:
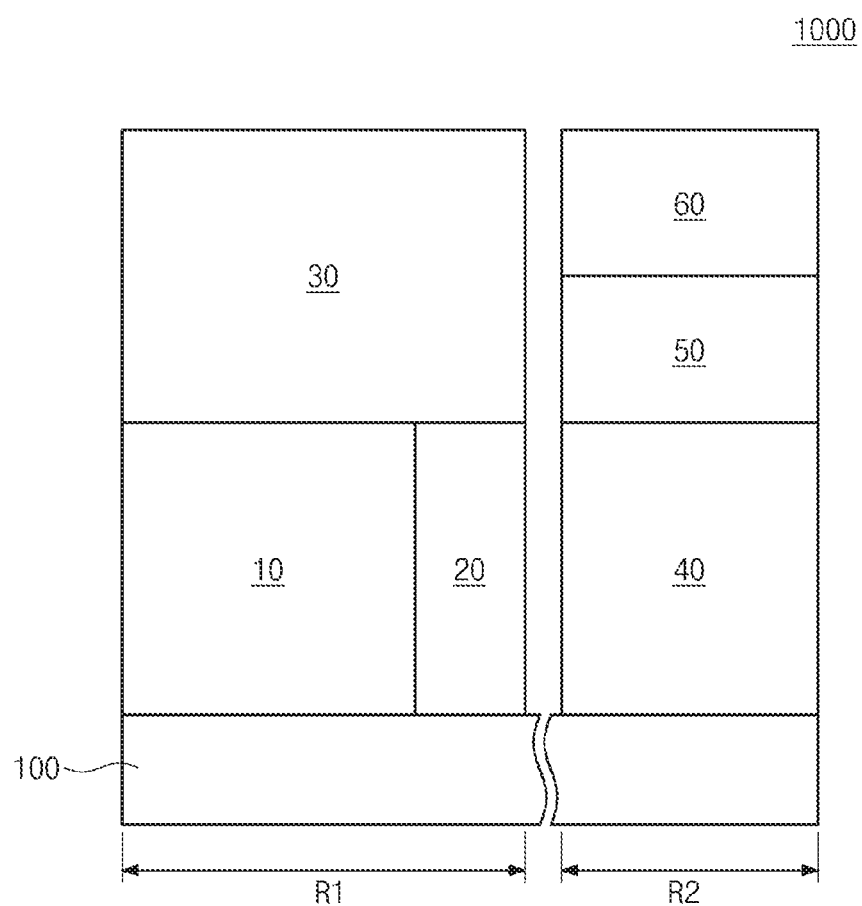
FIG. 1 is a cross-sectional view showing an arrangement inside a semiconductor device according to an exemplary embodiment of the present inventive concept.

It will be hereinafter described exemplary embodiments of the present inventive concept in conjunction with the accompanying drawings in which like reference numerals may refer to like elements.

Figure 2:
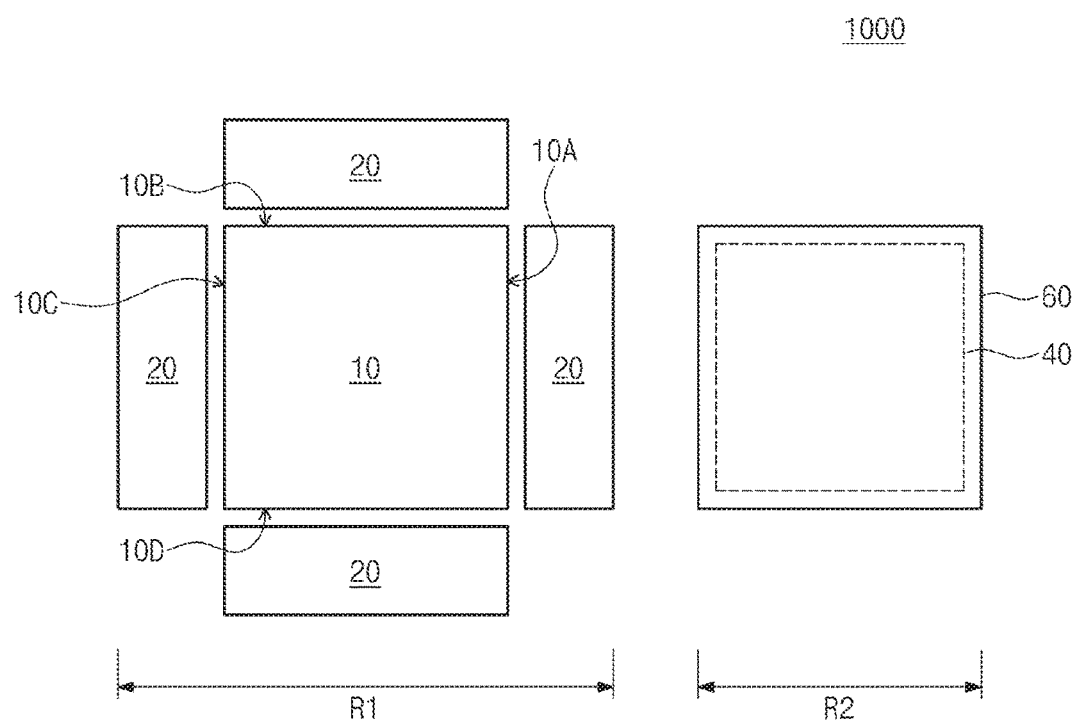
FIG. 2 is a plan view showing an arrangement of a first memory section, a first peripheral circuit section, a second memory section, and a second peripheral circuit section of FIG. 1, according to an exemplary embodiment of the present inventive concept.

FIG. 1 is a cross-sectional view showing an arrangement inside a semiconductor device according to an exemplary embodiment of the present inventive concept. FIG. 2 illustrates a plan view showing an arrangement of a first memory section, a first peripheral circuit section, a second memory section, and a second peripheral circuit section of FIG. 1, according to an exemplary embodiment of the present inventive concept.

Referring to FIGS. 1 and 2, a semiconductor device 1000 may include a substrate 100 including a first device region R1 and a second device region R2. The first device region R1 and the second device region R2 may be different regions of the substrate 100.

The semiconductor device 1000 may include a first memory section 10, a first peripheral circuit section 20, and a first wiring section 30 that are provided on the first device region R1. The first memory section 10 and the first peripheral circuit section 20 may be disposed side-by-side on the substrate 100. For example, the first memory section 10 and the first peripheral circuit section 20 may be disposed next to each other. As another example, a side of the first memory section 10 and a side of the first peripheral circuit section 20 may be adjacent, close or alongside each other. The first peripheral circuit section 20 may be provided on at least one side of the first memory section 10. For example, the first peripheral circuit section 20 may be adjacent to only one side 10A of the first memory section 10, adjacent to two sides 10A and 10B of the first memory section 10, adjacent to three sides 10A, 10B, and 10C of the first memory section 10, adjacent to four sides 10A, 10B, 10C, and 10D of the first memory section 10. In the last case, the first peripheral circuit section 20 may surround the first memory section 10. The first wiring section 30 may be provided on the first memory section 10 and the first peripheral circuit section 20. The first memory section 10 and the first peripheral circuit section 20 may be interposed between the substrate 100 and the first wiring section 30.

The semiconductor device 1000 may include a second memory section 60, a second peripheral circuit section 40, and a second wiring section 50 that are provided on the second device region R2. The second memory section 60 may be provided on the substrate 100, and the second peripheral circuit section 40 may be interposed between the substrate 100 and the second memory section 60. When viewed in a plan view, at least a portion of the second peripheral circuit section 40 may overlap the second memory section 60. The second wiring section 50 may be interposed between the second memory section 60 and the second peripheral circuit section 40. The second peripheral circuit section 40 may be side-by-side with the first memory section 10 and the first peripheral circuit section 20. The second wiring section 50 may be side-by-side with the first wiring section 30 and adjacent to a lower portion of the first wiring section 30. The second memory section 60 may be side-by-side with the first wiring section 30 and adjacent to an upper portion of the first wiring section 30. When viewed in a plan view, the second memory section 60, the second peripheral circuit section 40, and the second wiring section 50 may be laterally spaced apart from the first memory section 10.

The first memory section 10 may include a dynamic random access memory (DRAM) cell array structure, and the second memory section 60 may include a variable resistance memory cell array structure. For example, the first and second memory sections 10 and 60 may each function as a main memory, albeit separately. Alternatively, one of the first and second memory sections 10 and 60 may act as a main memory, and the other of the first and second memory sections 10 and 60 may act as a buffer memory.

Figure 3:
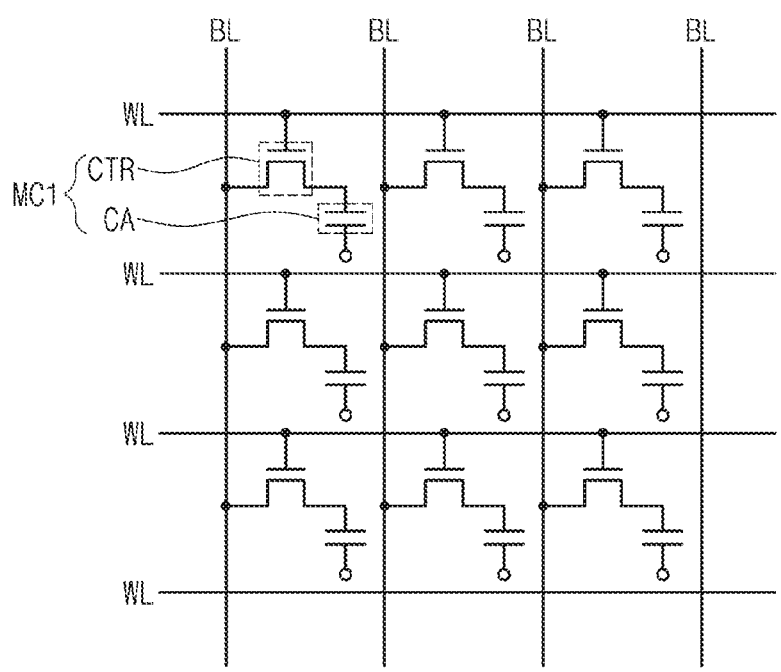
FIG. 3 is a circuit diagram showing a memory cell array of a first memory section of FIG. 1, according to an exemplary embodiment of the present inventive concept.

FIG. 3 is a circuit diagram showing a memory cell array of the first memory section 10 of FIG. 1, according to an exemplary embodiment of the present inventive concept.

Referring to FIG. 3, the first memory section 10 may include a DRAM cell array. For example, the first memory section 10 may include a plurality of word lines WL, a plurality of bit lines BL crossing the word lines WL, and a plurality of first memory cells MC1. Each of the first memory cells MC1 may be connected to a corresponding one of the word lines WL and to a corresponding one of the bit lines BL. Each of the first memory cells MC1 may include a cell transistor CTR connected to its corresponding word line WL, and a capacitor CA connected to one terminal of the cell transistor CTR. The cell transistor CTR may have a drain region connected to the corresponding bit line BL of its first memory cell MC1 and a source region connected to the capacitor CA. The cell transistor CTR may selectively control a current flow into the capacitor CA. Each of the first memory cells MC1 may store data of "0" or "1" depending on whether the capacitor CA stores charges or not.

Figure 4:
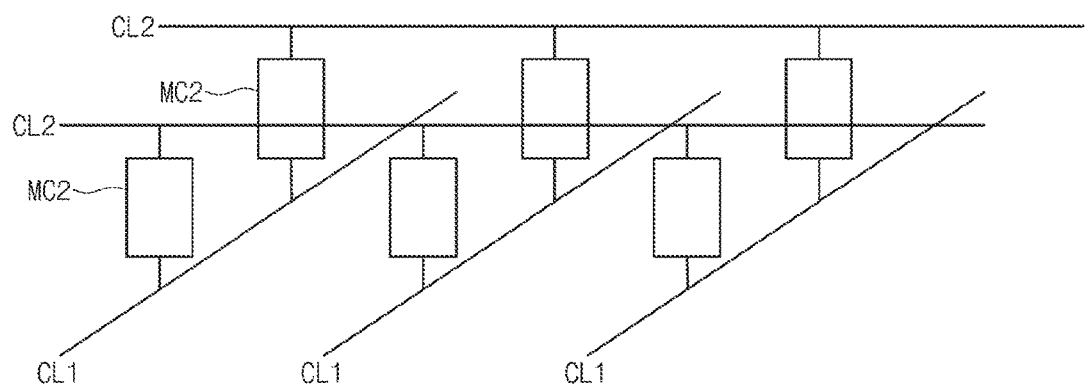
FIG. 4 is a circuit diagram showing a memory cell array of a second memory section of FIG. 1, according to an exemplary embodiment of the present inventive concept.
Figure 5:
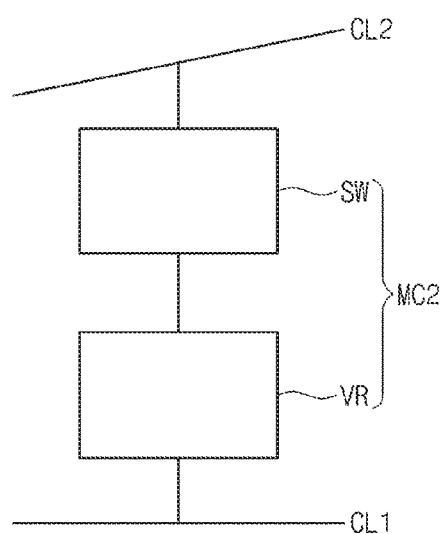
FIG. 5 is a circuit diagram showing a unit memory cell of a second memory section of FIG. 1, according to an exemplary embodiment of the present inventive concept.

FIG. 4 is a circuit diagram showing a memory cell array of the second memory section 60 of FIG. 1, according to an exemplary embodiment of the present inventive concept. FIG. 5 is a circuit diagram showing a unit memory cell of the second memory section 60 of FIG. 1, according to an exemplary embodiment of the present inventive concept.

Referring to FIGS. 4 and 5, the second memory section 60 may include a variable resistance memory cell array. The variable resistance memory cell array may include one or more of a magnetic random access memory (MRAM) cell array, a phase change random access memory (PRAM) cell array, and a resistive random access memory (RRAM) cell array. For example, the second memory section 60 may include a plurality of first conductive lines CL1, a plurality of second conductive lines CL2 crossing the first conductive lines CL1, and a plurality of second memory cells MC2 between the first conductive lines CL1 and the second conductive lines CL2. The second memory cells MC2 may be respectively provided at intersections of the first conductive lines CL1 and the second conducive lines CL2 in a plan view.

Each of the second memory cells MC2 may be provided at an intersection of a corresponding one of the first conductive lines CL1 and a corresponding one of the second conductive lines CL2. Each of the second memory cells MC2 may be connected to its corresponding first conductive line CL1 and to its corresponding second conductive line CL2. Each of the second memory cells MC2 may include a variable resistance element VR and a select element SW. The variable resistance element VR and the select element SW may be coupled in series between the corresponding first conductive line CL1 and the corresponding second conductive line CL2. For example, the variable resistance element VR may be connected between the select element SW and the corresponding first conductive line CL1, and the select element SW may be connected between the variable resistance element VR and the corresponding second conductive line CL2. Alternatively, the variable resistance element VR may be connected between the select element SW and the corresponding second conductive line CL2, and the select element SW may be connected between the variable resistance element VR and the corresponding first conductive line CL1.

The variable resistance element VR may include a data storage element. The variable resistance element VR may have two or more stable resistance states, which reversibly vary depending on an applied voltage or current and are maintained as long as no other power is provided. Each of the second memory cells MC2 may store data corresponding to a resistance state of the variable resistance element VR.

The select element SW may selectively control an amount of current passing through the variable resistance element VR. For example, the select element SW may exhibit a non-linear I-V or rectifying characteristic, and thus, the amount of current passing through each of the second memory cells MC2 may be easily controlled to have a unidirectional property. As another example, the select element SW may include a non-linear resistor exhibiting a resistance property that varies depending on an applied voltage. For example, when a resistance of such resistor is inversely proportional to an applied voltage, a selected cell under a high voltage may be in a lower resistance state allowing a current to pass through the selected cell, while a non-selected cell under a low voltage may be in a high resistance state preventing a current from passing through the non-selected cell. In yet another example, the select element SW may be a device based on a threshold switching that exhibits a non-linear I-V curve (e.g., an S-type I-V curve). The select element SW may be an Ovonic Threshold Switch (OTS) device exhibiting bidirectional characteristics.

The second memory section 60 may further include third conductive lines, which cross the second conductive lines CL2, and additional second memory cells MC2, which are provided between the second conductive lines CL2 and the third conductive lines. The additional second memory cells MC2 may be respectively provided at intersections of the second conductive lines CL2 and the third conducive lines in a plan view. This way, the second memory section 60 may have a cross-point cell array structure in which the second memory cells MC2 are three-dimensionally arranged along parallel and perpendicular directions with respect to a top surface of the substrate 100 of FIG. 1.

Referring back to FIGS. 1 and 2, the first peripheral circuit section 20 may include a first peripheral circuit that drives the first memory cells MC1 of FIG. 3. The first peripheral circuit may include a row decoder connected to the word lines WL of FIG. 3, a column decoder connected to the bit lines BL of FIG. 3, and an input/output (I/O) sense amplifier. The first wiring section 30 may include first line patterns that electrically connect the first memory cells MC1 of FIG. 3 to the first peripheral circuit. The second peripheral circuit section 40 may include a second peripheral circuit that drives the second memory cells MC2 of FIG. 4. The second peripheral circuit may include a first decoder circuit connected to the first conductive lines CL1 of FIG. 4, a second decoder circuit connected to the second conductive lines CL2 of FIG. 4, and an I/O sense amplifier connected to the first conductive lines CL1 or the second conductive lines CL2. The second wiring section 50 may include second line patterns that electrically connect the second memory cells MC2 of FIG. 4 to the second peripheral circuit.

Figure 6:
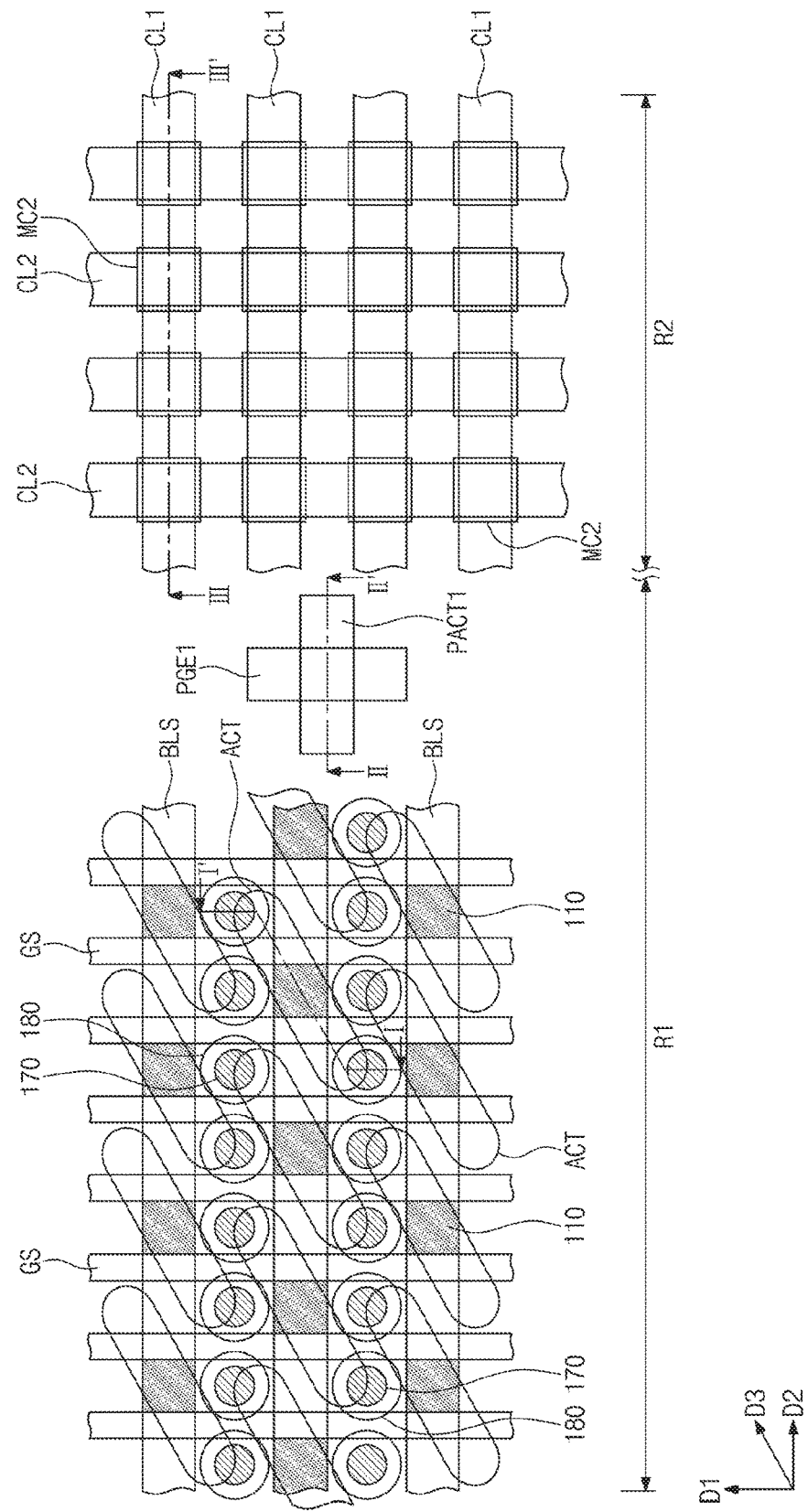
FIG. 6 is a plan view showing a semiconductor device according to an exemplary embodiment of the present inventive concept.
Figure 7:
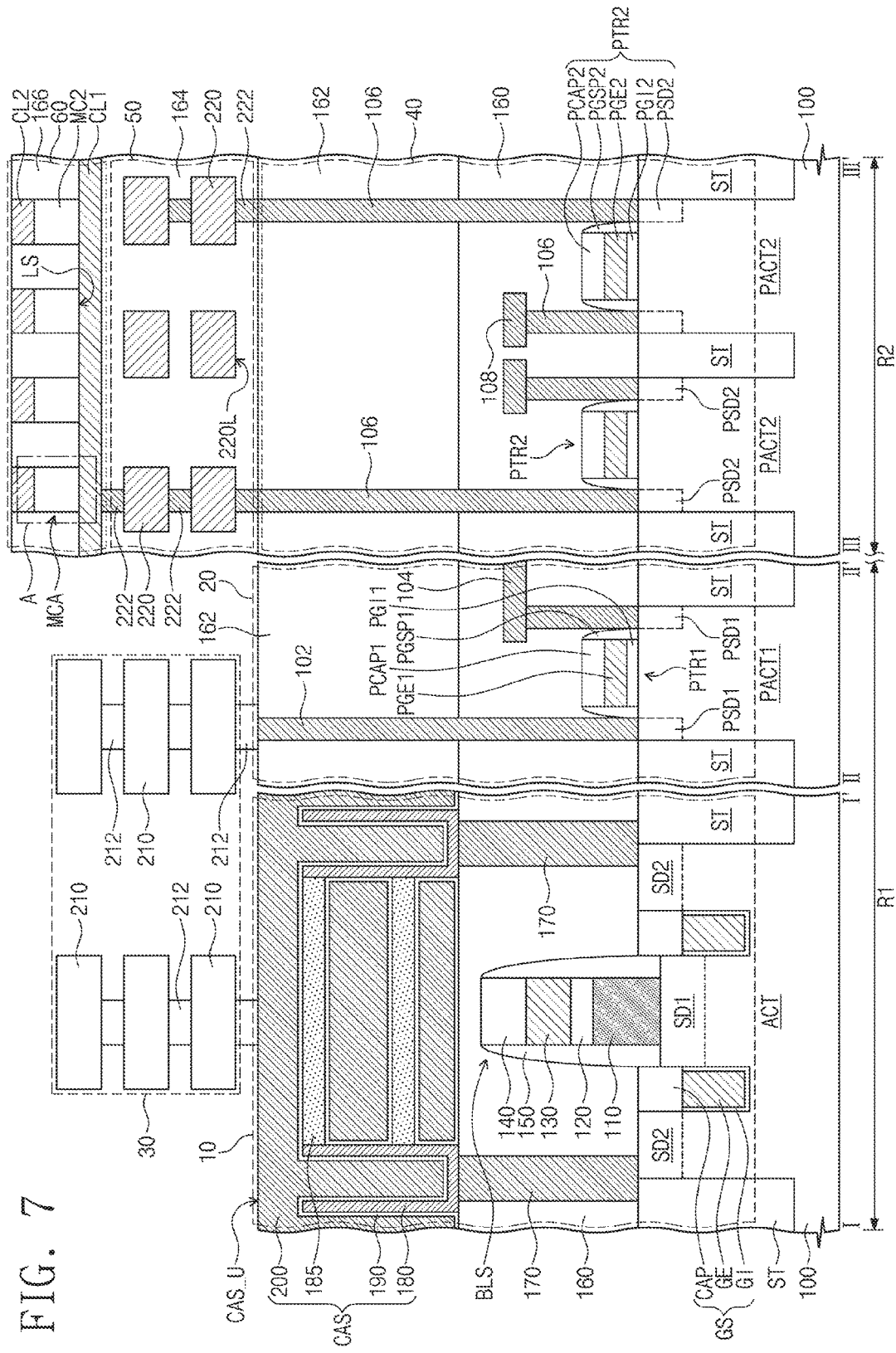
FIG. 7 is a cross-sectional view taken along lines I-I', II-II', and III-III' of FIG. 6, according to an exemplary embodiment of the present inventive concept.
Figure 8:
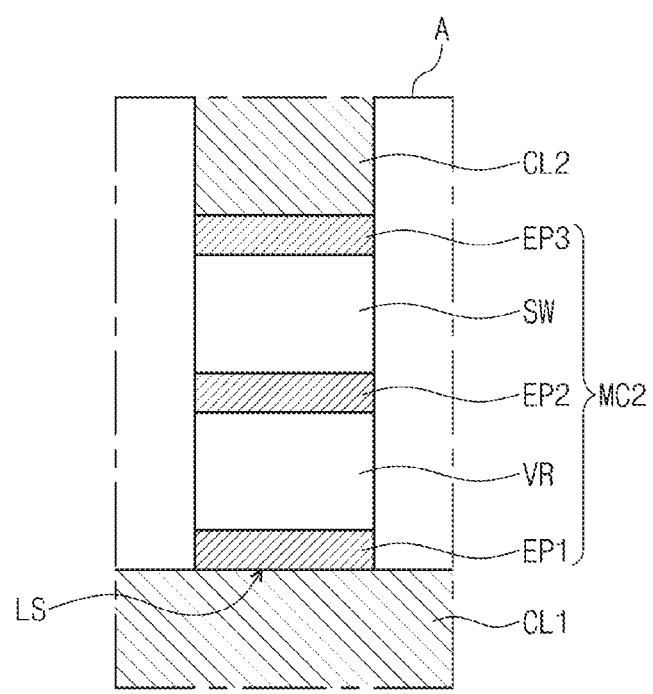
FIG. 8 is an enlarged view showing section A of FIG. 7, according to an exemplary embodiment of the present inventive concept.

FIG. 6 is a plan view showing a semiconductor device according to an exemplary embodiment of the present inventive concept. FIG. 7 is a cross-sectional view taken along lines I-I', II-II', and III-III' of FIG. 6, according to an exemplary embodiment of the present inventive concept. FIG. 8 is an enlarged view showing section A of FIG. 7, according to an exemplary embodiment of the present inventive concept.

Referring to FIGS. 6 and 7, the substrate 100 may include the first device region R1 and the second device region R2. The substrate 100 may be a semiconductor substrate such as a silicon substrate, a germanium substrate, or a silicon-germanium substrate. The first device region R1 and the second device region R2 may be different regions of the substrate 100. The substrate 100 may be provided with a device isolation layer ST for defining active regions. The device isolation layer ST may be provided on the substrate 100. The active regions may include a cell active region ACT, a first peripheral active region PACT1, and a second peripheral active region PACT2. The cell active region ACT and the first peripheral active region PACT1 may be provided on the first device region R1 of the substrate 100. The second peripheral active region PACT2 may be provided on the second device region R2 of the substrate 100. The device isolation layer ST may include, for example, a silicon oxide layer, a silicon nitride layer, and/or a silicon oxynitride layer.

The first memory section 10 may be provided on the first device region R1 of the substrate 100. The first memory section 10 may include a plurality of the cell active regions ACT. When viewed in a plan view, as shown in FIG. 6, each of the cell active regions ACT may have a bar shape, which is positioned to associate its longitudinal axis with a third direction D3 crossing first and second directions D1 and D2. The second direction D2 may cross the first direction D1, and the first to third directions D1, D2, and D3 may be parallel with a top surface of the substrate 100.

The first memory section 10 may include gate structures GS that are provided in the substrate 100 and extend across the cell active regions ACT. The gate structures GS may correspond to the word lines WL discussed with reference to FIG. 3. The gate structures GS may extend lengthwise in the first direction D1 and may be arranged in the second direction D2. Each of the gate structures GS may include a gate electrode GE buried in the substrate 100, a gate dielectric pattern GI between the gate electrode GE and the cell active regions ACT and between the gate electrode GE and the device isolation layer ST, and a gate capping pattern CAP on a top surface of the gate electrode GE. The gate capping pattern CAP may have a top surface substantially coplanar with the top surface of the substrate 100. In an exemplary embodiment of the present inventive concept, the gate capping pattern CAP may have a bottom surface in contact with a topmost surface of the gate dielectric pattern GI and have opposite sidewalls in contact with the cell active regions ACT and/or the device isolation layer ST. In an exemplary embodiment of the present inventive concept, the gate dielectric pattern GI may extend between the gate capping pattern CAP and the cell active regions ACT and/or between the gate capping pattern CAP and the device isolation layer ST.

The gate electrode GE may include a conductive material. For example, the conductive material may include one or more of a doped semiconductor (e.g., doped silicon, doped germanium, etc.), a conductive metal nitride (e.g., titanium nitride, tantalum nitride, etc.), a metal (e.g., tungsten, titanium, tantalum, etc.), and a metal-semiconductor compound (e.g., tungsten silicide, cobalt silicide, titanium silicide, etc.). The gate dielectric pattern GI may include, for example, a silicon oxide layer, a silicon nitride layer, and/or a silicon oxynitride layer. The gate capping pattern CAP may include, for example, a silicon oxide layer, a silicon nitride layer, and/or a silicon oxynitride layer.

The first memory section 10 may include a first impurity region SD1 and second impurity regions SD2 that are provided in each of the cell active regions ACT. The second impurity regions SD2 may be spaced apart from each other across the first impurity region SD1. The first impurity region SD1 may be provided in one cell active region ACT between a pair of gate structures GS extending across the one cell active region ACT. The second impurity regions SD2 may be provided in the one cell active region ACT and may be spaced apart from each other across the pair of gate structures GS. The first impurity region SD1 may be provided deeper in the substrate 100 than the second impurity regions SD2. The first impurity region SD1 may include the same conductive impurity as those of the second impurity regions SD2.

The first memory section 10 may include bit line structures BLS that are provided on the substrate 100 and extend across the gate structures GS. The bit line structures BLS may correspond to the bit lines BL discussed with reference to FIG. 3. The bit line structures BLS may extend in the second direction D2 and may be arranged in the first direction D1. Each of the bit line structures BLS may include a conductive contact 110 electrically connected to the first impurity region SD1, a conductive line 130 on the conductive contact 110 and extending in the second direction D2, and a barrier pattern 120 between the conductive contact 110 and the conductive line 130. Each of the bit line structures BLS may be electrically connected through the conductive contact 110 to the first impurity region SD1 of a corresponding one of the cell active regions ACT. The conductive contact 110 may be in contact with the first impurity region SD1. The conductive contact 110 may have a bottom surface lower than the top surface of the substrate 100. The conductive contact 110 may have opposite sidewalls aligned with opposite sidewalls of the conductive line 130. Each of the bit line structures BLS may include a capping pattern 140 on a top surface of the conductive line 130 and include spacer patterns 150 on side surfaces of the conductive line 130. The capping pattern 140 and the spacer patterns 150 may extend in the second direction D2 along the top and side surfaces of the conductive line 130. The spacer patterns 150 may cover side surfaces of capping pattern 140, the barrier pattern 120, and the conductive contact 110, and may be in contact with the first impurity region SD1.

The conductive contact 110 may include, for example, one or more of a doped semiconductor (e.g., doped silicon, doped germanium, etc.), a conductive metal nitride (e.g., titanium nitride, tantalum nitride, etc.), a metal (e.g., tungsten, titanium, tantalum, etc.), and a metal-semiconductor compound (e.g., tungsten silicide, cobalt silicide, titanium silicide, etc.). The conductive line 130 and the barrier pattern 120 may each include one or more of a conducive metal nitride (e.g., titanium nitride, tantalum nitride, etc.), a metal (e.g., tungsten, titanium, tantalum, etc.), and a metal-semiconductor compound (e.g., tungsten silicide, cobalt silicide, titanium silicide, etc.). The capping pattern 140 and the spacer patterns 150 may each include, for example, a silicon nitride layer, a silicon oxide layer, and/or a silicon oxynitride layer.

The first memory section 10 may include a first interlayer dielectric layer 160 that is provided on the substrate 100 and covers the bit line structures BLS. The first interlayer dielectric layer 160 may include a silicon oxide layer, a silicon nitride layer, and/or a silicon oxynitride layer. The first memory section 10 may include buried contacts 170 provided in the first interlayer dielectric layer 160. The buried contacts 170 may penetrate the first interlayer dielectric layer 160 and be electrically connected to corresponding second impurity regions SD2 in each of the cell active regions ACT. The buried contacts 170 may include a conductive material such as metal or doped silicon.

The first memory section 10 may include a capacitor structure CAS on the first interlayer dielectric layer 160. The capacitor structure CAS may include bottom electrodes 180 that are provided on the first interlayer dielectric layer 160 and are connected to corresponding buried contacts 170. The bottom electrodes 180 may be electrically connected through corresponding buried contacts 170 to corresponding second impurity regions SD2. The bottom electrodes 180 may have a cup or "U" like shape, but the present inventive concept is not limited thereto. The capacitor structure CAS may include a support structure 185 for structurally supporting the bottom electrodes 180. The support structure 185 may be in contact with side surfaces of the bottom electrodes 180. The capacitor structure CAS may include a top electrode 200, which covers the bottom electrodes 180 and the support structure 185. The bottom electrodes 180 and the support structure 185 may be buried in the top electrode 200. When the bottom electrodes 180 have a cup shape (e.g., a hollow cylindrical shape whose bottom end is closed), the top electrode 200 may cover outer and inner surfaces of each bottom electrode 180. The capacitor structure CAS may include a dielectric layer 190 interposed between the support structure 185 and the top electrode 200 and between the top electrode 200 and each of the bottom electrodes 180. Each of the bottom electrodes 180, the top electrode 200 covering each of the bottom electrodes 180, and the dielectric layer 190 between the top electrode 200 and each of the bottom electrodes 180 may constitute the capacitor CA discussed with reference to FIG. 3.

The bottom electrodes 180 and the top electrode 200 may include one or more of polysilicon, metal, metal silicide, and metal nitride. The dielectric layer 190 may include one or more of an oxide layer (e.g., a silicon oxide layer), a nitride layer (e.g., a silicon nitride layer), an oxynitride layer (e.g., a silicon oxynitride layer), and a high-k dielectric layer (e.g., a hafnium oxide layer). The support structure 185 may include an insulating material. For example, the support structure 185 may include one or more of an oxide layer, a nitride layer, and an oxynitride layer.

The first peripheral circuit section 20 may be provided on the first device region R1 of the substrate 100 and disposed on at least one side of the first memory section 10. The first peripheral circuit section 20 may include the first peripheral active region PACT1 and a first peripheral transistor PTR1 on the first peripheral active region PACT1. The first peripheral transistor PTR1 may include a first peripheral gate electrode PGE1 extending across the first peripheral active region PACT1, a first peripheral gate dielectric pattern PGI1 between the substrate 100 and the first peripheral gate electrode PGE1, a first peripheral gate capping pattern PCAP1 on a top surface of the first peripheral gate electrode PGE1, first peripheral gate spacers PGSP1 on side surfaces of the first peripheral gate electrode PGE1, and first peripheral source/drain regions PSD1 in the first peripheral active region PACT1 on opposite sides of the first peripheral gate electrode PGE1. The first peripheral gate electrode PGE1 may include a conductive material. The first peripheral gate dielectric pattern PGI1, the first peripheral gate capping pattern PCAP1, and the first peripheral gate spacers PGSP1 may include an oxide layer, a nitride layer, and/or an oxynitride layer. The first peripheral source/drain regions PSD1 may be impurity regions provided in the substrate 100.

The first peripheral circuit section 20 may include first peripheral contacts 102 and first peripheral lines 104 that are electrically connected to the first peripheral transistor PTR1. The first peripheral contacts 102 and the first peripheral lines 104 may include a conductive material. The first peripheral transistor PTR1, the first peripheral contacts 102, and the first peripheral lines 104 may constitute the first peripheral circuit that drives the first memory cells MC1 of FIG. 3.

The first interlayer dielectric layer 160 may extend along the top surface of the substrate 100 to cover the first peripheral transistor PTR1. The first peripheral contacts 102 and the first peripheral lines 104 may penetrate at least a portion of the first interlayer dielectric layer 160 to be electrically connected to the first peripheral transistor PTR1.

The first peripheral circuit section 20 may include the first interlayer dielectric layer 160 on the first peripheral transistor PTR1 and include a second interlayer dielectric layer 162 on the first interlayer dielectric layer 160. At least one of the first peripheral contacts 102 and the first peripheral lines 104 may be provided in the second interlayer dielectric layer 162. The second interlayer dielectric layer 162 may include a silicon oxide layer, a silicon nitride layer, and/or a silicon oxynitride layer.

The first wiring section 30 may be provided on the first device region R1 of the substrate 100. The first memory section 10 and the first peripheral circuit section 20 may be disposed between the substrate 100 and the first wiring section 30. The first wiring section 30 may include first line patterns 210 and first line contacts 212, which are provided on the capacitor structure CAS and the second interlayer dielectric layer 162. The first line patterns 210 and the first line contacts 212 may be provided at a level from the substrate 100 higher than that of the capacitor structure CAS. The first line patterns 210 and the first line contacts 212 may be positioned at a height from the substrate 100 greater than that of the capacitor structure CAS. In other words, the first line patterns 210 and the first line contacts 212 may be farther from the substrate 100 than the capacitor structure CAS. As an example, the first line patterns 210 and the first line contacts 212 may be disposed above the capacitor structure CAS.

The first line patterns 210 and the first line contacts 212 may electrically connect the first peripheral circuit to the first memory cells MC1 of FIG. 3. The first peripheral transistor PTR1 may be electrically connected through corresponding first line contacts 212 to corresponding first line patterns 210. The gate structures GS may be electrically connected through corresponding first line contacts 212 to corresponding first line patterns 210, and the bit line structures BLS may be electrically connected through corresponding first line contacts 212 to corresponding first line patterns 210. The top electrode 200 of the capacitor structure CAS may be electrically connected through corresponding first line contacts 212 to corresponding first line patterns 210.

The second peripheral circuit section 40 may be provided on the second device region R2 of the substrate 100. The second peripheral circuit section 40 may include the second peripheral active region PACT2 and a second peripheral transistor PTR2 on the second peripheral active region PACT2. The second peripheral transistor PTR2 may include a second peripheral gate electrode PGE2 extending across the second peripheral active region PACT2, a second peripheral gate dielectric pattern PGI2 between the substrate 100 and the second peripheral gate electrode PGE2, a second peripheral gate capping pattern PCAP2 on a top surface of the second peripheral gate electrode PGE2, second peripheral gate spacers PGSP2 on side surfaces of the second peripheral gate electrode PGE2, and second peripheral source/drain regions PSD2 in the second peripheral active region PACT2 on opposite sides of the second peripheral gate electrode PGE2.

The first peripheral transistor PTR1 and the second peripheral transistor PTR2 may be provided at substantially the same level from the substrate 100. The first peripheral transistor PTR1 and the second peripheral transistor PTR2 may be positioned at substantially the same height from the substrate 100. The first and second peripheral transistors PTR1 and PTR2 may be the same in terms of one or more of their structure, their material, and their formation method. For example, the first peripheral gate electrode PGE1, the first peripheral gate dielectric pattern PGI1, the first peripheral gate capping pattern PCAP1, the first peripheral gate spacers PGSP1, and the first peripheral source/drain regions PSD1 may be respectively the same as the second peripheral gate electrode PGE2, the second peripheral gate dielectric pattern PGI2, the second peripheral gate capping pattern PCAP2, the second peripheral gate spacers PGSP2, and the second peripheral source/drain regions PSD2, in terms of one or more of their structure, their material, and their formation method. In an exemplary embodiment of the present inventive concept, the first peripheral gate electrode PGE1, the first peripheral gate dielectric pattern PGI1, the first peripheral gate capping pattern PCAP1, the first peripheral gate spacers PGSP1, and the first peripheral source/drain regions PSD1 may be formed simultaneously, respectively, with the second peripheral gate electrode PGE2, the second peripheral gate dielectric pattern PGI2, the second peripheral gate capping pattern PCAP2, the second peripheral gate spacers PGSP2, and the second peripheral source/drain regions PSD2.

The second peripheral circuit section 40 may include second peripheral contacts 106 and second peripheral lines 108 that are electrically connected to the second peripheral transistor PTR2. The second peripheral contacts 106 and the second peripheral lines 108 may include a conductive material. The second peripheral transistor PTR2, the second peripheral contacts 106, and the second peripheral lines 108 may constitute the second peripheral circuit that drives the second memory cells MC2 of FIG. 4.

The first interlayer dielectric layer 160 and the second interlayer dielectric layer 162 may extend onto the second device region R2 of the substrate 100 to cover the second peripheral transistor PTR2. The second peripheral contacts 106 and the second peripheral lines 108 may partially penetrate the first and second interlayer dielectric layers 160 and 162 to be electrically connected to the second peripheral transistor PTR2. The second peripheral circuit section 40 may include the first and second interlayer dielectric layers 160 and 162 sequentially stacked on the second device region R2 of the substrate 100.

The second wiring section 50 may be provided on the second device region R2 of the substrate 100, and the second peripheral circuit section 40 may be disposed between the substrate 100 and the second wiring section 50. The second wiring section 50 may include second line patterns 220 and second line contacts 222, which are provided on the second interlayer dielectric layer 162. The second line patterns 220 and the second line contacts 222 may electrically connect the second peripheral circuit to the second memory cells MC2 of FIG. 4. The second peripheral transistor PTR2 may be electrically connected through corresponding second line contacts 222 to corresponding second line patterns 220.

The second line patterns 220 and the second line contacts 222 may be provided at a level from the substrate 100 higher than that of the capacitor structure CAS. The second line patterns 220 and the second line contacts 222 may be positioned at a height from the substrate 100 greater than that of the capacitor structure CAS. For example, lowermost ones of the second line patterns 220 may have bottom surfaces 220L at a height the same as or greater than that of a topmost surface CAS_U of the capacitor structure CAS. As an example, the second line patterns 220 may be disposed higher than the capacitor structure CAS in a direction perpendicular to a top surface of the substrate 100. In an exemplary embodiment of the present inventive concept, at least one of the second line patterns 220 may be provided at the same height from the substrate 100 as that of at least one of the first line patterns 210. For example, the lowermost ones of the second line patterns 220 may be provided at the same height from the substrate 100 as that of lowermost ones of the first line patterns 210. In an exemplary embodiment of the present inventive concept, the second line patterns 220 and the second line contacts 222 may be formed after the capacitor structure CAS is formed. At least one of the second line patterns 220 and at least one of the second line contacts 222 may be formed simultaneously with at least one of the first line patterns 210 and of the first line contacts 212. The second wiring section 50 may include a third interlayer dielectric layer 164 that is provided on the second interlayer dielectric layer 162 and covers the second line patterns 220 and the second line contacts 222. The third interlayer dielectric layer 164 may include a silicon oxide layer, a silicon nitride layer, and/or a silicon oxynitride layer.

The second memory section 60 may be provided on the second device region R2 of the substrate 100. The second peripheral circuit section 40 and the second wiring section 50 may be disposed between the substrate 100 and the second memory section 60. The second memory section 60 may include first conductive lines CL1 and second conductive lines CL2, which are provided on the third interlayer dielectric layer 164. The first conductive lines CL1 may extend in the second direction D2 and may be arranged in the first direction D1. The second conductive lines CL2 may be spaced apart from the first conductive lines CL1 along a direction perpendicular to the top surface of the substrate 100. The second conductive lines CL2 may extend in the first direction D1 and may be arranged in the second direction D2. The second conductive lines CL2 may cross over the first conductive lines CL1. The first conductive lines CL1 and the second conductive lines CL2 may include a metal (e.g., copper, tungsten, or aluminum) and/or a metal nitride (e.g., tantalum nitride, titanium nitride, or tungsten nitride).

The second memory section 60 may include a plurality of memory cells MC2 between the first conductive lines CL1 and the second conducive lines CL2. The memory cells MC2 may correspond to the second memory cells MC2 discussed with reference to FIGS. 4 and 5. The memory cells MC2 may be respectively provided at intersections of the first conductive lines CL1 and the second conducive lines CL2 in a plan view. The memory cells MC2 may be two-dimensionally arranged along the first and second directions D1 and D2. The memory cells MC2 may constitute a memory cell stack MCA. Although only a single memory cell stack MCA is illustrated for convenience of description, the second memory section 60 may include a plurality of memory cell stacks MCA stacked in the direction perpendicular to the top surface of the substrate 100. In this case, the substrate 100 may be provided thereon with repeatedly stacked structures corresponding to the memory cell stack MCA and the first and second conductive lines CL1 and CL2.

Referring to FIG. 8, each of the memory cells MC2 may include a variable resistance element VR and a select element SW that are coupled in series between a corresponding first conductive line CL1 and a corresponding second conductive line CL2. The variable resistance element VR may be provided between the corresponding first conductive line CL1 and the select element SW, but the present inventive concept is not limited thereto. For example, the select element SW may be provided between the corresponding first conductive line CL1 and the variable resistance element VR.

The variable resistance element VR may include a material capable of storing data based on resistance variation. In an exemplary embodiment of the present inventive concept, the variable resistance element VR may include a material that can reversibly change its phase between a crystalline state and an amorphous state, based on a temperature of the material. The variable resistance element VR may include a compound in which one or more of Te and Se (e.g., chalcogen elements) are combined with one or more of Ge, Sb, Bi, Pb, Sn, Ag, As, S, Si, In, Ti, Ga, P, O, and C. For example, the variable resistance element VR may include one or more of GeSbTe, GeTeAs, SbTeSe, GeTe, SbTe, SeTeSn, GeTeSe, SbSeBi, GeBiTe, GeTeTi, InSe, GaTeSe, and InSbTe. Alternatively, the variable resistance element VR may include a superlattice structure in which a Ge-containing layer (e.g., a GeTe layer) and a Ge-free layer (e.g., an SbTe layer) are repeatedly stacked. In an exemplary embodiment of the present inventive concept, the variable resistance element VR may include one or more of perovskite compounds and conductive metal oxides. For example, the variable resistance element VR may include one or more of niobium oxide, titanium oxide, nickel oxide, zirconium oxide, vanadium oxide, PCMO((Pr,Ca)MnO$_3$), strontium-titanium oxide, barium-strontium-titanium oxide, strontium-zirconium oxide, barium-zirconium oxide, and barium-strontium-zirconium oxide. In an exemplary embodiment of the present inventive concept, the variable resistance element VR may have a double structure including a conductive metal oxide layer and a tunnel insulating layer or a triple structure including a first conductive metal oxide layer, a tunnel insulating layer, and a second conductive metal oxide layer. In this case, the tunnel insulating layer may include aluminum oxide, hafnium oxide, or silicon oxide.

The select element SW may include, for example, a diode exhibiting rectifying characteristics such as a silicon diode or an oxide diode. In this case, the select element SW may include a silicon diode in which a p-type Si and an n-type Si are joined together or an oxide diode in which a p-type NiOx and an n-type TiOx, or a p-type CuOx and an n-type TiOx, are joined together. In an exemplary embodiment of the present inventive concept, the select element SW may include an oxide material, for example, ZnOx, MgOx, and AlOx, which has a high resistance state for preventing electric current flow at a voltage less than a specific voltage and a low resistance state for allowing electric current flow at a voltage greater than the specific voltage. In an exemplary embodiment of the present inventive concept, the select element SW may be an Ovonic Threshold Switch (OTS) device exhibiting bidirectional characteristics. In this case, the select element SW may include a substantially amorphous chalcogenide material. The phrase "substantially amorphous state" may not exclude the presence of a locally crystalline grain boundary or a locally crystalline portion. The chalcogenide material may include a compound in which one or more of Te and Se (e.g., chalcogen elements)

are combined with one or more of Ge, Sb, Bi, Al, Pb, Sn, Ag, As, S, Si, In, Ti, Ga, and P. For example, the chalcogenide material may include one or more of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, and GeAsBiSe.

Each of the memory cells MC2 may include a first electrode EP1 between the variable resistance element VR and the corresponding first conductive line CL1, a second electrode EP2 between the variable resistance element VR and the select element SW, and a third electrode EP3 between the select element SW and the corresponding second conductive line CL2. The second electrode EP2 may electrically connect the variable resistance element VR and the select element SW to each other, and may prevent a direct contact between the variable resistance element VR and the select element SW. The variable resistance element VR may be electrically connected through the first electrode EP1 to the corresponding first conductive line CL1, and the select element SW may be electrically connected through the third electrode EP3 to the corresponding second conductive line CL2. The first electrode EP1 may be a heater electrode that heats up the variable resistance element VR to change the phase state of the variable resistance element VR. In other words, the heat emitted from the first electrode EP1 may cause the phase state of the variable resistance element VR to change. The first electrode EP1 may include a material whose resistivity is greater than the resistivity of the first and second conductive lines CL1 and CL2. Each of the first to third electrodes EP1, EP2, and EP3 may include one or more of W, Ti, Al, Cu, C, CN, TiN, TiAlN, TiSiN, TiCN, WN, CoSiN, WSiN, TaN, TaCN, and TaSiN.

Referring to FIGS. 7 and 8, the memory cells MC2 may be provided at a level from the substrate 100 higher than that of the capacitor structure CAS. The memory cells MC2 may be positioned at a height from the substrate 100 greater than that of the capacitor structure CAS. The memory cells MC2 may have bottommost surfaces LS at a height greater than that of the topmost surface CAS_U of the capacitor structure CAS. The bottommost surface LS of each memory cell MC2 may correspond to a bottommost surface of the first electrode EP1. The variable resistance element VR and the select element SW of each memory cell MC2 may be provided at a height greater than that of the topmost surface CAS_U of the capacitor structure CAS. In an exemplary embodiment of the present inventive concept, the first conductive lines CL1, the second conductive lines CL2, and the memory cells MC2 may be formed after the capacitor structure CAS is formed and after at least one of the first line patterns 210 and the first line contacts 212 is formed.

Referring back to FIGS. 6 and 7, the second memory section 60 may include a fourth interlayer dielectric layer 166 that is provided on the third interlayer dielectric layer 164 and covers the memory cells MC2. The fourth interlayer dielectric layer 166 may cover the first and second conductive lines CL1 and CL2. The fourth interlayer dielectric layer 166 may include a silicon oxide layer, a silicon nitride layer, and/or a silicon oxynitride layer.

The second line patterns 220 and the second line contacts 222 of the second wiring section 50 may electrically connect the second peripheral circuit to the memory cells MC2 (e.g., the second memory cells MC2 of FIG. 4). The first conductive lines CL1 may be electrically connected through corresponding second line contacts 222 to corresponding second line patterns 220, and, the second conductive lines CL2 may be electrically connected through corresponding second line contacts 222 to corresponding second line patterns 220. The memory cells MC2 may be disposed above the second line patterns 220 and the second line contacts 222 in a direction substantially perpendicular to a top surface of the substrate 100.

Figure 9:
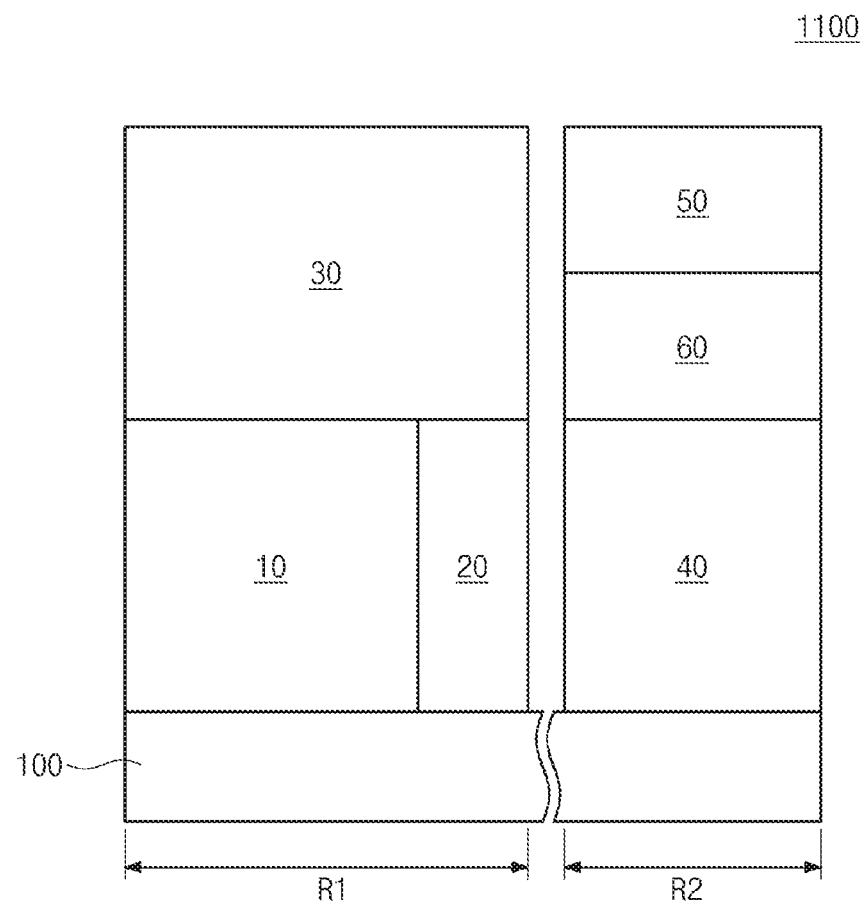
FIG. 9 is a cross-sectional view showing an arrangement inside a semiconductor device according to an exemplary embodiment of the present inventive concept.
Figure 10:
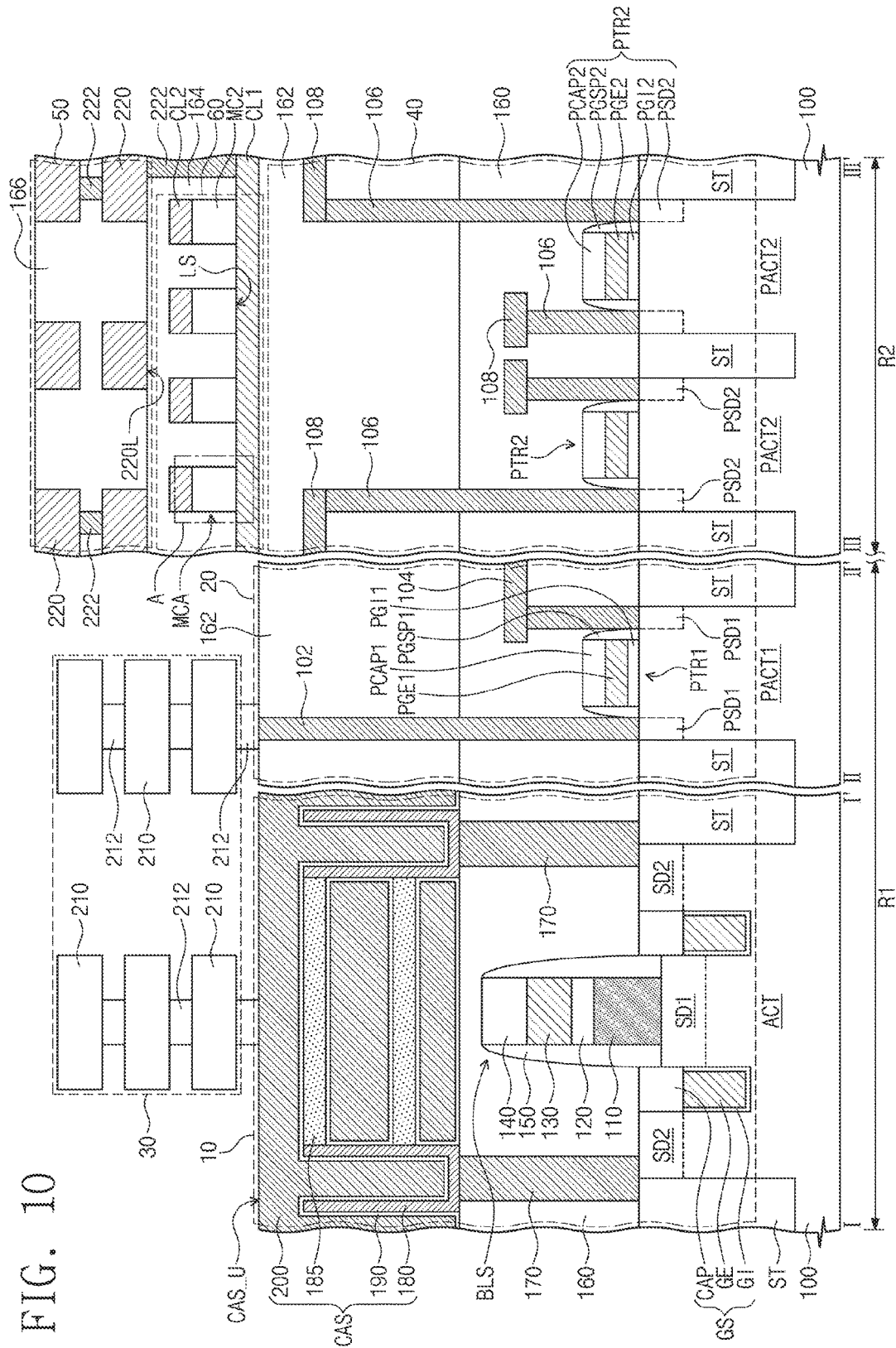
FIG. 10 is a cross-sectional view taken along lines I-I', II-II', and III-III' of FIG. 6, showing the semiconductor device of FIG. 9, according to an exemplary embodiment of the present inventive concept.

FIG. 9 is a cross-sectional view showing an arrangement inside a semiconductor device according to an exemplary embodiment of the present inventive concept. FIG. 10 illustrates a cross-sectional view taken along lines I-I', II-II', and III-III' of FIG. 6, showing the semiconductor device of FIG. 9, according to an exemplary embodiment of the present inventive concept. Components the same as those of the semiconductor device discussed with reference to FIGS. 1 to 8 have the same reference numerals allocated thereto, and differences from the semiconductor device of FIGS. 1 to 8 are mostly explained for brevity of description.

Referring to FIG. 9, a semiconductor device 1100 may include the substrate 100 including the first device region R1 and the second device region R2. The semiconductor device 1100 may include the first memory section 10, the first peripheral circuit section 20, and the first wiring section 30 that are provided on the first device region R1. The first memory section 10, the first peripheral circuit section 20, and the first wiring section 30 may be substantially the same as those discussed with reference to FIGS. 1 to 5.

The semiconductor device 1100 may include the second memory section 60, the second peripheral circuit section 40, and the second wiring section 50 that are provided on the second device region R2. In an exemplary embodiment of the present inventive concept, the second wiring section 50 may be provided on the substrate 100, and the second memory section 60 may be provided between the substrate 100 and the second wiring section 50. The second peripheral circuit section 40 may be provided between the substrate 100 and the second memory section 60. The second peripheral circuit section 40 may be provided side-by-side with the first memory section 10 and the first peripheral circuit section 20. The second memory section 60 may be provided side-by-side with the first wiring section 30 and, more specifically, adjacent to a lower portion of the first wiring section 30. The second wiring section 50 may be provided side-by-side with the first wiring section 30 and, more specifically, adjacent to an upper portion of the first wiring section 30. The second memory section 60, the second peripheral circuit section 40, and the second wiring section 50 may be substantially the same as those discussed with reference to FIGS. 1 to 5, except for the difference mentioned above.

Referring to FIGS. 6 and 10, the first memory section 10, the first peripheral circuit section 20, and the first wiring section 30 may be provided on the first device region R1 of the substrate 100. The first memory section 10, the first peripheral circuit section 20, and the first wiring section 30 may be substantially the same as those discussed with reference to FIGS. 6 and 7.

The second peripheral circuit section 40 may be provided on the second device region R2 of the substrate 100. The second peripheral circuit section 40 may include the second peripheral active region PACT2 and the second peripheral transistor PTR2 on the second peripheral active region PACT2. The second peripheral circuit section 40 may include the second peripheral contacts 106 and the second peripheral lines 108 that are electrically connected to the second peripheral transistor PTR2. The second peripheral circuit section 40 may include the first and second interlayer dielectric layers 160 and 162 sequentially stacked on the second device region R2 of the substrate 100. The first and second interlayer dielectric layers 160 and 162 may extend onto the second device region R2 from the first device region R1 of the substrate 100 to cover the second peripheral transistor PTR2. The second peripheral contacts 106 and the second peripheral lines 108 may partially penetrate the first and second interlayer dielectric layers 160 and 162 to be electrically connected to the second peripheral transistor PTR2.

The second memory section 60 may be provided on the second device region R2 of the substrate 100, and the second peripheral circuit section 40 may be disposed between the substrate 100 and the second memory section 60. The second memory section 60 may include the first and second conductive lines CL1 and CL2 on the second interlayer dielectric layer 162. The second memory section 60 may include the plurality of memory cells MC2 between the first conductive lines CL1 and the second conducive lines CL2. The memory cells MC2 may be respectively provided at intersections between the first conductive lines CL1 and the second conducive lines CL2 in a plan view. As discussed with reference to FIG. 8, each of the memory cells MC2 may include the variable resistance element VR and the select element SW that are coupled in series between the corresponding first conductive line CL1 and the corresponding second conductive line CL2. Each of the memory cells MC2 may include the first electrode EP1 between the variable resistance element VR and the corresponding first conductive line CL1, the second electrode EP2 between the variable resistance element VR and the select element SW, and the third electrode EP3 between the select element SW and the corresponding second conductive line CL2.

The memory cells MC2 may be provided at a level from the substrate 100 higher than that of the capacitor structure CAS. The memory cells MC2 may be positioned at a height from the substrate 100 greater than that of the capacitor structure CAS. The bottommost surfaces LS of the memory cells MC2 may be positioned at a height from the substrate 100 the same as or greater than that of the topmost surface CAS_U of the capacitor structure CAS. The bottommost surface LS of each memory cell MC2 may correspond to a bottommost surface of the first electrode EP1. The variable resistance element VR and the select element SW of each memory cell MC2 may be provided at a height greater than that of the topmost surface CAS_U of the capacitor structure CAS. In an exemplary embodiment of the present inventive concept, the first conductive lines CL1, the second conductive lines CL2, and the memory cells MC2 may be formed after the capacitor structure CAS is formed. The second memory section 60 may include the third interlayer dielectric layer 164 that is provided on the second interlayer dielectric layer 162 and covers the memory cells MC2. The third interlayer dielectric layer 164 may cover the first and second conductive lines CL1 and CL2.

The second wiring section 50 may be provided on the second device region R2 of the substrate 100, and the second peripheral circuit section 40 and the second memory section 60 may be disposed between the substrate 100 and the second wiring section 50. The second wiring section 50 may include the second line patterns 220 and the second line contacts 222, which are provided on the third interlayer dielectric layer 164. The second line patterns 220 and the second line contacts 222 may electrically connect the memory cells MC2 of the second memory section 60 to the second peripheral circuit of the second peripheral circuit section 40.

The second line patterns 220 and the second line contacts 222 may be provided at a level from the substrate 100 higher than that of the capacitor structure CAS. The second line patterns 220 and the second line contacts 222 may be positioned at a height from the substrate 100 greater than that of the capacitor structure CAS. For example, lowermost ones of the second line patterns 220 may have bottom surfaces 220L at a height greater than that of the topmost surface CAS_U of the capacitor structure CAS. In an exemplary embodiment of the present inventive concept, the second line patterns 220 and the second line contacts 222 may be formed after the capacitor structure CAS is formed. At least one of the second line patterns 220 and of the second line contacts 222 may be formed simultaneously with at least one of the first line patterns 210 and of the first line contacts 212. The second wiring section 50 may include the fourth interlayer dielectric layer 166 that is provided on the third interlayer dielectric layer 164 and covers the second line patterns 220 and the second line contacts 222.

The second peripheral circuit section 40, the second memory section 60, and the second wiring section 50 may be substantially the same as those discussed with reference to FIGS. 6 to 8, except for the difference mentioned above.

Figure 11:
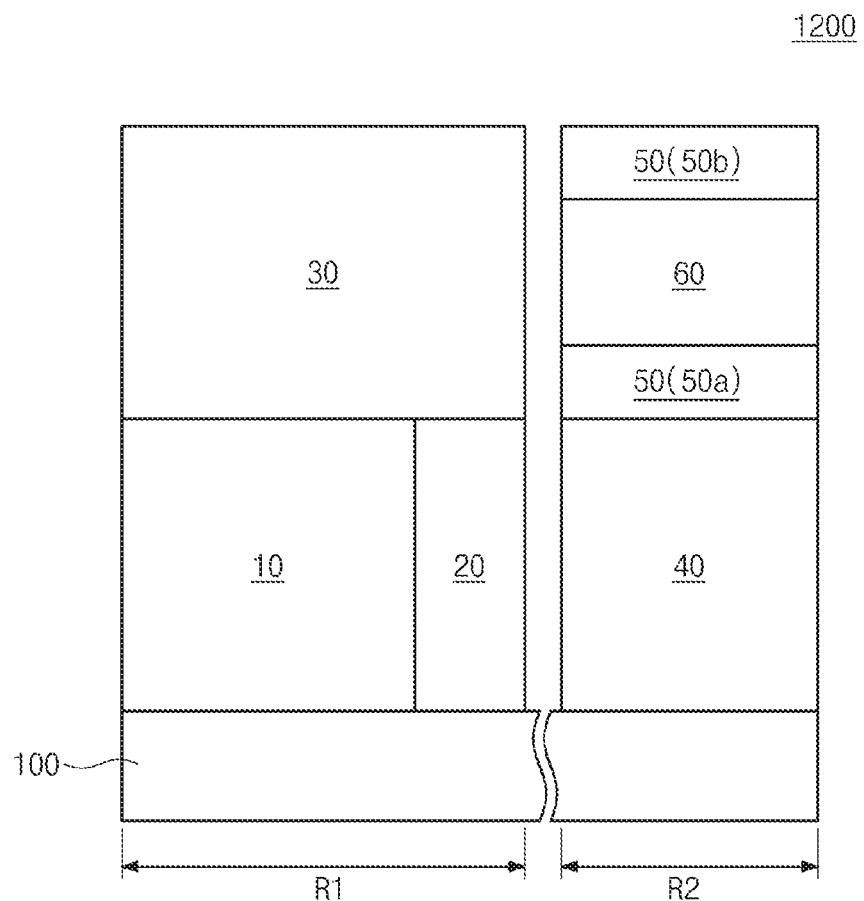
FIG. 11 is a cross-sectional view showing an arrangement inside a semiconductor device according to an exemplary embodiment of the present inventive concept.
Figure 12:
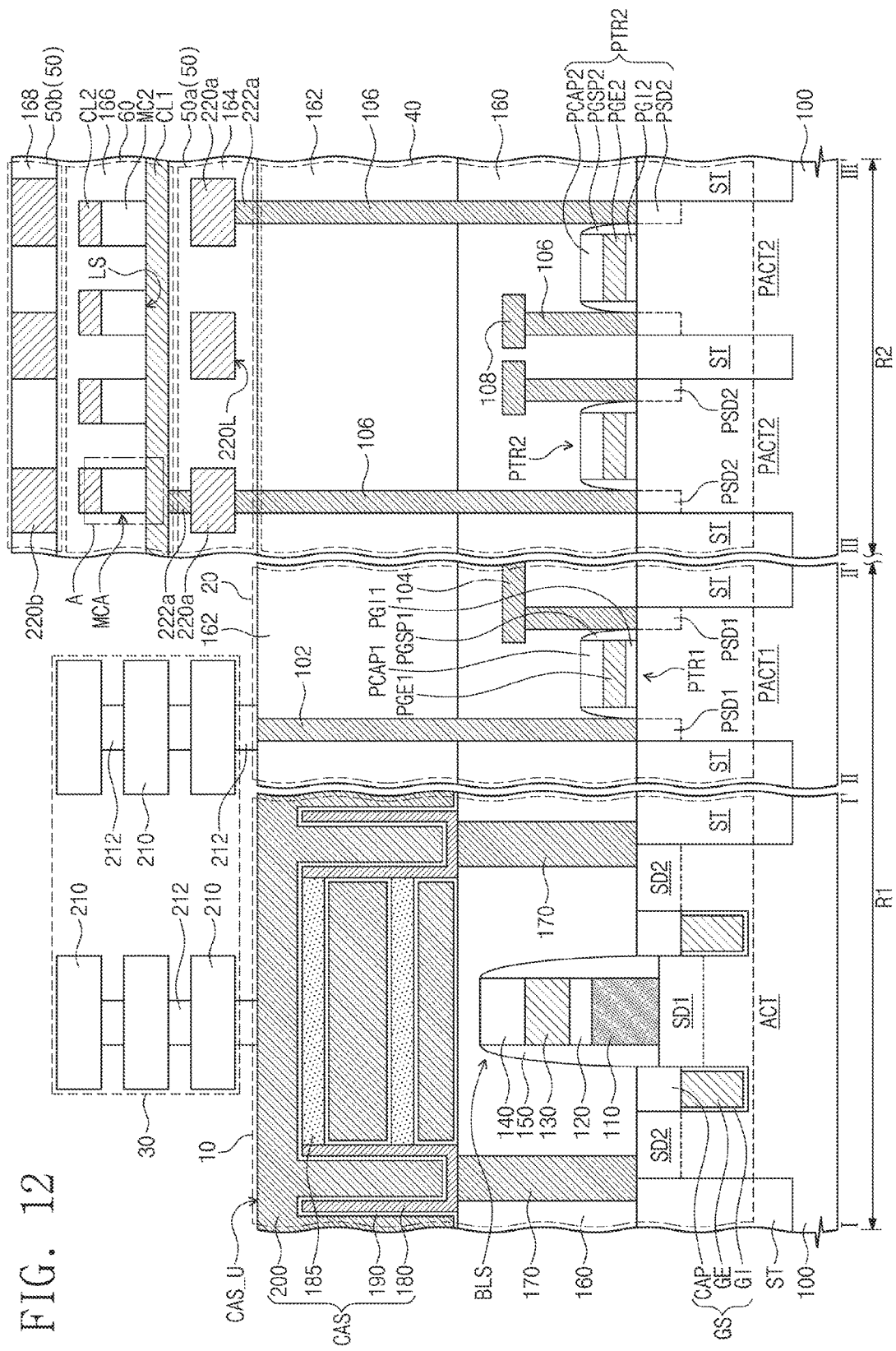
FIG. 12 is a cross-sectional view taken along lines I-I', II-II', and III-III' of FIG. 6, showing the semiconductor device of FIG. 11, according to an exemplary embodiment of the present inventive concept.

FIG. 11 is a cross-sectional view showing an arrangement inside a semiconductor device according to an exemplary embodiment of the present inventive concept. FIG. 12 illustrates a cross-sectional view taken along lines I-I', II-II', and III-III' of FIG. 6, showing the semiconductor device of FIG. 11, according to an exemplary embodiment of the present inventive concept. Components the same as those of the semiconductor device discussed with reference to FIGS. 1 to 8 have the same reference numerals allocated thereto, and differences from the semiconductor device of FIGS. 1 to 8 are mostly explained for brevity of description.

Referring to FIG. 11, a semiconductor device 1200 may include the substrate 100 including the first device region R1 and the second device region R2. The semiconductor device 1200 may include the first memory section 10, the first peripheral circuit section 20, and the first wiring section 30 that are provided on the first device region R1. The first memory section 10, the first peripheral circuit section 20, and the first wiring section 30 may be substantially the same as those discussed with reference to FIGS. 1 to 5.

The semiconductor device 1200 may include the second memory section 60, the second peripheral circuit section 40, and the second wiring section 50 that are provided on the second device region R2. In an exemplary embodiment of the present inventive concept, the second memory section 60 may be provided on the substrate 100, and the second peripheral circuit section 40 may be provided between the substrate 100 and the second memory section 60. The second wiring section 50 may include a lower wiring section 50a between the second peripheral circuit section 40 and the second memory section 60, and include an upper wiring section 50b spaced apart from the lower wiring section 50a. The upper wiring section 50b and the lower wiring section 50a may be disposed on opposite sides of the second memory section 60. The lower wiring section 50a may be provided side-by-side with the first wiring section 30 and, more specifically, adjacent to a lower portion of the first wiring section 30. The upper wiring section 50b may be provided side-by-side with the first wiring section 30 and, more specifically, adjacent to an upper portion of the first wiring section 30. The second memory section 60 may be provided between the lower wiring section 50a and the upper wiring section 50b. In addition, the lower wiring section 50a and the upper wiring section 50b may be provided on one side of the first wiring section 30. The second memory section 60, the second peripheral circuit section 40, and the second wiring section 50 may be substantially the same as those discussed with reference to FIGS. 1 to 5, except for the difference mentioned above.

Referring to FIGS. 6 and 12, the first memory section 10, the first peripheral circuit section 20, and the first wiring section 30 may be provided on the first device region R1 of the substrate 100. The first memory section 10, the first peripheral circuit section 20, and the first wiring section 30 may be substantially the same as those discussed with reference to FIGS. 6 and 7.

The second peripheral circuit section 40 may be provided on the second device region R2 of the substrate 100. The second peripheral circuit section 40 may include the second peripheral active region PACT2 and the second peripheral transistor PTR2 on the second peripheral active region PACT2. The second peripheral circuit section 40 may include the second peripheral contacts 106 and the second peripheral lines 108 that are electrically connected to the second peripheral transistor PTR2. The second peripheral circuit section 40 may include the first and second interlayer dielectric layers 160 and 162 sequentially stacked on the second device region R2 of the substrate 100. The first and second interlayer dielectric layers 160 and 162 may extend onto the second device region R2 from the first device region R1 of the substrate 100 to cover the second peripheral transistor PTR2. The second peripheral contacts 106 and the second peripheral lines 108 may partially penetrate the first and second interlayer dielectric layers 160 and 162 to be electrically connected to the second peripheral transistor PTR2.

The lower wiring section 50a may be provided on the second device region R2 of the substrate 100, and the second peripheral circuit section 40 may be disposed between the substrate 10 and the lower wiring section 50a. The lower wiring section 50a may include lower line patterns 220a and lower line contacts 222a, which are provided on the second interlayer dielectric layer 162.

The lower line patterns 220a and the lower line contacts 222a may be provided at a level from the substrate 100 higher than that of the capacitor structure CAS. The lower line patterns 220a and the lower line contacts 222a may be positioned at a height from the substrate 100 greater than that of the capacitor structure CAS. For example, lowermost ones of the lower line patterns 220a may have bottom surfaces 220L at a height the same as or greater than that of the topmost surface CAS_U of the capacitor structure CAS. In an exemplary embodiment of the present inventive concept, at least one of the lower line patterns 220a may be provided at the same height from the substrate 100 as that of at least one of the first line patterns 210. For example, the lowermost ones of the lower line patterns 220a may be provided at the same height from the substrate 100 as that of lowermost ones of the first line patterns 210. In an exemplary embodiment of the present inventive concept, the lower line patterns 220a and the lower line contacts 222a may be formed after the capacitor structure CAS is formed. At least one of the lower line patterns 220a and at least one of the lower line contacts 222a may be formed simultaneously with at least one of the first line patterns 210 and at least one of the first line contacts 212. The lower wiring section 50a may include the third interlayer dielectric layer 164 that is provided on the second interlayer dielectric layer 162 and covers the lower line patterns 220a and the lower line contacts 222a.

The second memory section 60 may be provided on the second device region R2 of the substrate 100, and the second peripheral circuit section 40 and the lower wiring section 50a may be disposed between the substrate 100 and the second memory section 60. The second memory section 60 may include the first and second conductive lines CL1 and CL2, which are provided on the third interlayer dielectric layer 164. The second memory section 60 may include the plurality of memory cells MC2 between the first conductive lines CL1 and the second conducive lines CL2. The memory cells MC2 may be respectively provided at intersections of the first conductive lines CL1 and the second conducive lines CL2. As discussed with reference to FIG. 8, each of the memory cells MC2 may include the variable resistance element VR and the select element SW that are coupled in series between the corresponding first conductive line CL1 and the corresponding second conductive line CL2. Each of the memory cells MC2 may include the first electrode EP1 between the variable resistance element VR and the corresponding first conductive line CL1, the second electrode EP2 between the variable resistance element VR and the select element SW, and the third electrode EP3 between the select element SW and the corresponding second conductive line CL2.

The memory cells MC2 may be provided at a level from the substrate 100 higher than that of the capacitor structure CAS. The memory cells MC2 may be positioned at a height from the substrate 100 greater than that of the capacitor structure CAS. The memory cells MC2 may have bottommost surfaces LS at a height greater than that of the topmost surface CAS_U of the capacitor structure CAS. The bottommost surface LS of each memory cell MC2 may correspond to a bottommost surface of the first electrode EP1. The variable resistance element VR and the select element SW of each memory cell MC2 may be provided at a height greater than that of the topmost surface CAS_U of the capacitor structure CAS. In an exemplary embodiment of the present inventive concept, the first conductive lines CL1, the second conductive lines CL2, and the memory cells MC2 may be formed after the capacitor structure CAS is formed and after at least one of the first line patterns 210 and the first line contacts 212 is formed. The second memory section 60 may include the fourth interlayer dielectric layer 166 that is provided on the third interlayer dielectric layer 164 and covers the memory cells MC2. The fourth interlayer dielectric layer 166 may cover the first and second conductive lines CL1 and CL2.

The upper wiring section 50b may be provided on the second device region R2 of the substrate 100, and the second peripheral circuit section 40, the lower wiring section 50a, and the second memory section 60 may be disposed between the substrate 100 and the upper wiring section 50b. The upper wiring section 50b may include upper line patterns 220b and upper line contacts, which are provided on the fourth interlayer dielectric layer 166. The upper line patterns 220b and the upper line contacts may be provided at a level from the substrate 100 higher than that of the capacitor structure CAS. The upper line patterns 220b and the upper line contacts may be positioned at a height from the substrate 100 greater than that of the capacitor structure CAS. In an exemplary embodiment of the present inventive concept, the upper line patterns 220b and the upper line contacts may be formed after the capacitor structure CAS is formed and after at least one of the first line patterns 210 and the first line contacts 212 is formed. At least one of the upper line patterns 220b and at least one of the upper line contacts may be formed simultaneously with at least one of the first line patterns 210 and at least one of the first line contacts 212. The upper wiring section 50b may include a fifth interlayer dielectric layer 168 that is provided on the fourth interlayer dielectric layer 166 and covers the upper line patterns 220b and the upper line contacts. The fifth interlayer dielectric layer 168 may include a silicon oxide layer, a silicon nitride layer, and/or a silicon oxynitride layer.

The lower wiring section 50a and the upper wiring section 50b may correspond to the second wiring section 50. The lower line patterns 220a and the upper line patterns 220b may correspond to the second line patterns 220 of the second wiring section 50, and the lower line contacts 222a and the upper line contacts may correspond to the second line contacts 222 of the second wiring section 50. The lower line patterns 220a, the lower line contacts 222a, the upper line patterns 220b, and the upper line contacts may electrically connect the memory cells MC2 of the second memory section 60 to the second peripheral circuit of the second peripheral circuit section 40. The second peripheral transistor PTR2 may be electrically connected through corresponding lower line contacts 222a to corresponding lower line patterns 220a, or through corresponding upper line contacts to corresponding upper line patterns 220b. The first conductive lines CL1 may be electrically connected through corresponding lower line contacts 222a to corresponding lower line patterns 220a, or through corresponding upper line contacts to corresponding upper line patterns 220b. The second conductive lines CL2 may be electrically connected through corresponding lower line contacts 222a to corresponding lower line patterns 220a. The second conductive lines CL2 may be electrically connected through corresponding upper line contacts to corresponding upper line patterns 220b.

According to an exemplary embodiment of the present inventive concept, the first memory section 10 and the first peripheral circuit section 20 may be disposed side-by-side on the first device region R1 of the substrate 100, and the second memory section 60, the second peripheral circuit section 40, and the second wiring section 50 may be vertically stacked on the second device region R2 of the substrate 100. The second peripheral transistor PTR2 of the second peripheral circuit section 40 may be provided at the same height as that of the first peripheral transistor PTR1 of the first peripheral circuit section 20. The second line patterns and contacts 220 and 222 of the second wiring section 50 and the memory cells MC2 of the second memory section 60 may be provided at a height greater than that of the capacitor structure CAS of the first memory section 10. This way, the first and second memory sections 10 and 60 having different operating characteristics may be provided on a single substrate 100. As a result, a highly-integrated semiconductor device may be provided.

While the present inventive concept has been described with reference to exemplary embodiments thereof, it will be understood by one of ordinary skill in the art that variations in form and detail may be made thereto without departing from the spirit and scope of the present inventive concept.

What is claimed is:

1. A semiconductor device, comprising:
    a first memory section, a first peripheral circuit section, and a second peripheral circuit section that are disposed on a substrate; and
    a second memory section and a wiring section that are stacked on the second peripheral circuit section, wherein
    the first memory section comprises a plurality of first memory cells, each of the first memory cells including a cell transistor and a capacitor connected to the cell transistor,
    the second memory section comprises a plurality of second memory cells, each of the second memory cells including a variable resistance element and a select element coupled in series to each other, and
    the wiring section comprises a plurality of line patterns, wherein the line patterns and the second memory cells are higher than the capacitor with respect to the substrate.

2. The semiconductor device of claim 1, wherein the second memory section and the wiring section are laterally spaced apart from the first memory section.

3. The semiconductor device of claim 1, wherein the second memory section overlaps the second peripheral circuit section.

4. The semiconductor device of claim 3, wherein at least one of the line patterns is interposed between the second peripheral circuit section and the second memory section.

5. The semiconductor device of claim 3, wherein the second memory section further comprises:
    a plurality of first conductive lines; and
    a plurality of second conductive lines crossing the first conductive lines,
    wherein the second memory cells are provided between the first conductive lines and the second conductive lines.

6. The semiconductor device of claim 5, wherein the second conductive lines are higher than the first conductive lines with respect to the substrate,
    wherein at least one of the line patterns is interposed between the second peripheral circuit section and the first conductive lines.

7. The semiconductor device of claim 1, wherein
    the first peripheral circuit section comprises a first peripheral transistor, and
    the second peripheral circuit section comprises a second peripheral transistor,
    wherein the first and second peripheral transistors are at the same height with respect to the substrate.

8. The semiconductor device of claim 7, wherein
    the first peripheral transistor drives at least one of the first memory cells, and
    the second peripheral transistor drives at least one of the second memory cells.

9. The semiconductor device of claim 1, further comprising a first wiring section disposed on the first memory section and the first peripheral circuit section,
    wherein the first wiring section comprises a plurality of first line patterns higher than the capacitor with respect to the substrate, and
    wherein the wiring section is a second wiring section and the line patterns are second line patterns.

10. The semiconductor device of claim 9, wherein at least one of the second line patterns and at least one of the first line patterns are at the same height with respect to the substrate.

11. The semiconductor device of claim 9, wherein the second memory cells are higher than that of at least one of the second line patterns with respect to the substrate.

12. The semiconductor device of claim 1, wherein the capacitor comprises:
    a first electrode connected to a terminal of the cell transistor;
    a second electrode covering the first electrode; and a dielectric layer between the first electrode and the second electrode.

13. The semiconductor device of claim 1, wherein
the variable resistance element comprises a material whose phase is changeable between a crystalline state and an amorphous state, and
the select element comprises an amorphous chalcogenide material.

14. A semiconductor device, comprising:
a substrate including a first device region and a second device region;
a first memory section on the first device region; and
a second memory section and a wiring section stacked on the second device region, wherein
the first memory section comprises a capacitor structure,
the second memory section comprises:
   a plurality of variable resistance elements arranged on the substrate; and
   a plurality of select elements coupled in series to corresponding variable resistance elements, and
the wiring section comprises a plurality of line patterns,
wherein the line patterns, the variable resistance elements, and the select elements are higher from the substrate than the capacitor structure.

15. A semiconductor device, comprising:
a substrate;
a first memory section and a first peripheral circuit section disposed next to each other along a first direction;
a first wiring section disposed on the first memory section and the first peripheral circuit section; and
a second peripheral circuit section, a second wiring section and a second memory section stacked in a second direction substantially perpendicular to the first direction,
wherein the second memory section is disposed above the first memory section with respect to the substrate.

16. The semiconductor device of claim 15, wherein the second peripheral circuit section, the second wiring section and the second memory section are sequentially arranged.

17. The semiconductor device of claim 15, wherein the second peripheral circuit section, the second memory section and the second wiring section are sequentially arranged.

18. The semiconductor device of claim 15, wherein the second wiring section includes an upper wiring section and a lower wiring section disposed on opposite sides of the second memory section.

19. The semiconductor device of claim 15, wherein the second memory section includes line patterns, contacts and memory cells disposed above a capacitor of the first memory section.

20. The semiconductor device of claim 15, wherein the first peripheral circuit section includes a first peripheral transistor, the second peripheral circuit section includes a second peripheral transistor and the first and second peripheral transistors are disposed at a same level with respect to the substrate.

* * * * *